(12) United States Patent
Lin

(10) Patent No.: US 12,453,222 B2
(45) Date of Patent: Oct. 21, 2025

(54) LIGHT EMITTING DEVICE AND MANUFACTURING METHOD THEREOF

(71) Applicant: Innolux Corporation, Miao-Li County (TW)

(72) Inventor: Ming-Chang Lin, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 869 days.

(21) Appl. No.: 17/543,747

(22) Filed: Dec. 7, 2021

(65) Prior Publication Data
US 2022/0216383 A1 Jul. 7, 2022

(30) Foreign Application Priority Data
Jan. 4, 2021 (CN) .......................... 202110004695.0

(51) Int. Cl.
*H10H 20/857* (2025.01)
*H10H 20/01* (2025.01)

(52) U.S. Cl.
CPC .......... *H10H 20/857* (2025.01); *H10H 20/01* (2025.01); *H10H 20/0364* (2025.01)

(58) Field of Classification Search
None
See application file for complete search history.

(56) References Cited

U.S. PATENT DOCUMENTS

| | | | |
|---|---|---|---|
| 2014/0239494 A1 | 8/2014 | Chen et al. | |
| 2018/0287098 A1* | 10/2018 | Hu | H05B 45/00 |
| 2020/0357971 A1 | 11/2020 | Lin et al. | |

OTHER PUBLICATIONS

"Office Action of China Counterpart Application", issued on Nov. 18, 2024, p. 1-p. 6.

* cited by examiner

Primary Examiner — Alexander G Ghyka
(74) Attorney, Agent, or Firm — JCIPRNET

(57) ABSTRACT

The disclosure provides a light emitting device and a manufacturing method thereof. The light emitting device includes a substrate, a light emitting element, and a bonding structure. The light emitting element is disposed on the substrate through the bonding structure. The bonding structure includes at least three bonding layers and at least two passivation layers, which are in a staggered arrangement. The method for manufacturing the light emitting device includes the following steps: providing a substrate, forming a first bonding layer on the substrate, forming a first passivation layer on the first bonding layer, providing a light emitting element, forming a second bonding layer on the light emitting element, forming a second passivation layer on the second bonding layer. The second passivation layer on the light emitting element is contacted with the first passivation layer to form a third bonding layer and bond the light emitting element on the substrate.

20 Claims, 5 Drawing Sheets

LIGHT EMITTING DEVICE AND MANUFACTURING METHOD THEREOF

CROSS-REFERENCE TO RELATED APPLICATION

This application claims the priority benefit of Chinese application serial no. 202110004695.0, filed on Jan. 4, 2021. The entirety of the above-mentioned patent application is hereby incorporated by reference herein and made a part of this specification.

BACKGROUND

Technical Field

The disclosure relates to a light emitting device and a manufacturing method thereof, and in particular to a light emitting device and a manufacturing method thereof that may reduce the problem of short-circuit during bonding or may improve the bonding yield.

Description of Related Art

With the miniaturization of light emitting devices and the development of light emitting elements towards integration and miniaturization, the spacing between the contacts of the light emitting elements is also shortened, making the bonding between the light emitting elements and the carrier board more and more difficult. Therefore, how to improve the bonding yield is now the goal of the industry.

SUMMARY

The disclosure provides a light emitting device and a manufacturing method thereof, capable of reducing a problem of short-circuit during bonding or improving bonding yield.

According to an embodiment of the disclosure, a light emitting device includes a substrate, a light emitting element, and a bonding structure. The light emitting element is disposed on the substrate. The light emitting element is disposed on the substrate through the bonding structure. The bonding structure includes at least three bonding layers and at least two passivation layers, and the at least three bonding layers and the at least two passivation layers are in a staggered arrangement.

According to an embodiment of the disclosure, a method for manufacturing a light emitting device includes the following steps. A substrate is provided. A first bonding layer is formed on the substrate. A first passivation layer is formed on the first bonding layer. A light emitting element is provided. A second bonding layer is formed on the light emitting element. A second passivation layer is formed on the second bonding layer. The second passivation layer on the light emitting element is contacted with the first passivation layer to form a third bonding layer and bond the light emitting element to the substrate.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
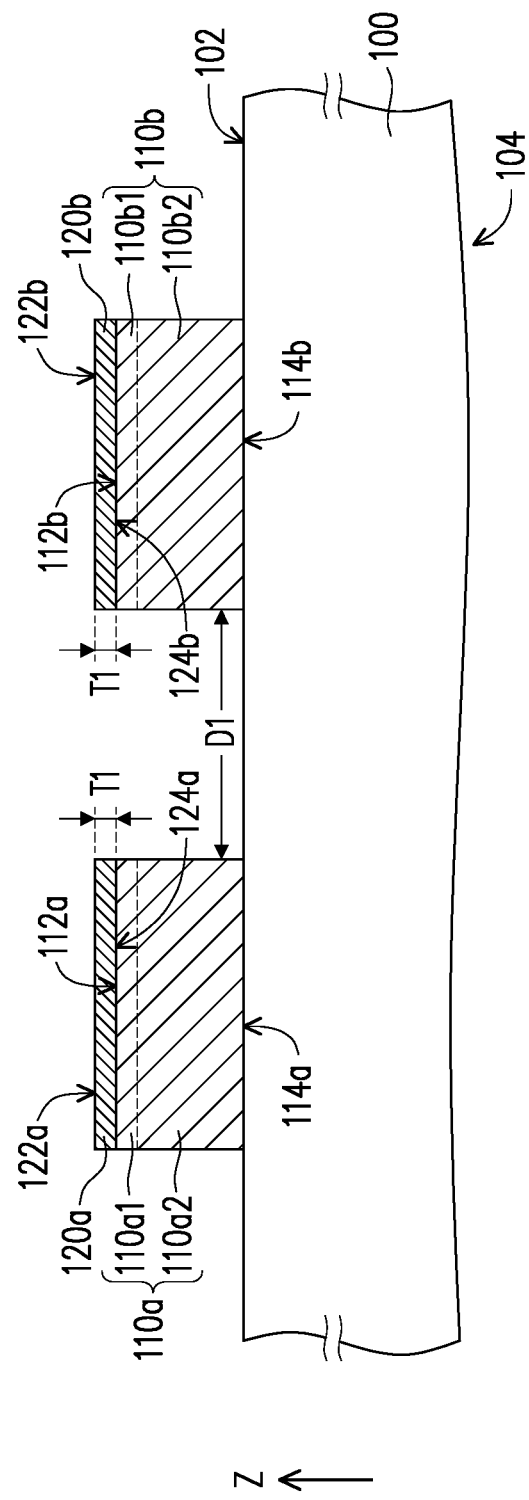
FIG. 1A to FIG. 1D are schematic cross-sectional views of a method of manufacturing a light emitting device according to an embodiment of the disclosure.

The disclosure can be understood by referring to the following detailed description and also in conjunction with the accompanying drawings. It should be noted that, for the reader's ease of understanding and for the sake of brevity of the accompanying drawings, only a portion of the light emitting device is illustrated in a number of the accompanying drawings in the disclosure, and that particular elements in the accompanying drawings are not drawn to actual scale. In addition, the number and dimensions of the components in the drawings are for illustrative purposes only and are not intended to limit the scope of the disclosure.

In the following description and the claims, terms such as "include" and "comprise" are open-ended, and therefore should be interpreted as "include but not limited to".

It should be understood that when a component or membrane layer is said to be "on" or "connected to" another component or membrane layer, it may be directly on or directly connected to such other component or membrane layer, or there may be an inserted component or membrane layer between the two (the non-direct case). Conversely, when the component is said to be "directly" on or "directly connected to" another component or membrane layer, there is no inserted component or membrane layer between the two.

It should be understood that while the terms first, second, third . . . may be used to describe a variety of constituent components, the constituent components are not limited to this terminology.

This term is used only to distinguish a single component from other components in the specification. Instead of using the same terminology in the claims, the terms first, second, third . . . are substituted in the order in which the components are declared in the claims. Therefore, in the following description, the first constituent component may be the second constituent component in the claims.

In some embodiments of the disclosure, terms such as "joint", "interconnection", etc., unless specifically defined, may refer to two structures in direct contact, or may refer to two structures that are not in direct contact and in which other structures are provided between the two structures. The terms about connecting and joint may also include the case where both structures are movable, or where both structures are fixed. In addition, the term "coupling" includes any direct and indirect means of electrical connection.

In the disclosure, the length and width can be measured by using an optical microscope, and the thickness can be measured by a profile image in an electron microscope, but not limited thereto. In addition, any two values or directions used for comparison may have a certain amount of error.

The types of light emitting devices disclosed in the disclosure may include display device, lighting device, etc., or other devices that contain light source, such as sensing device, touch device, and curved device, free shape display, bendable device, flexible device, tiled device, or a combination of the foregoing, but not limited thereto. The light emitting device may include a light emitting diode (LED), liquid crystal, fluorescence, phosphor, quantum dot (QD), other suitable materials, or a combination of the foregoing, but not limited thereto. The light emitting diode may include an organic light emitting diode (OLED), inorganic light emitting diode, sub-millimeter light emitting diode (mini LED), micro LED or quantum dot light emitting diode (QLED, QDLED), other suitable LED types or any combination of the above, but not limited thereto. The display device may also include, for example, a tiled display device, but is not limited thereto. The antenna device may be, for example, a liquid crystal antenna, but is not limited thereto. The antenna device may include, for example, a tiled antenna device, but is not limited thereto. It should be noted that the light emitting device can be any combination described above, but is not limited thereto. The light emitting device may have peripheral systems such as a driving system, a control system, a shelf system, etc. to support the display device, the lighting device, or the tiled device, etc., but the disclosure is not limited thereto.

It should be noted that the following embodiments can be used in a number of different embodiments by replacing, recombining, or mixing features to complete other embodiments without departing from the spirit of the disclosure. The features of each embodiment can be mixed and matched as long as they do not contradict the spirit of the disclosure or conflict with each other.

Reference will now be made in detail to exemplary embodiments of the disclosure, examples of which are illustrated in the accompanying drawings. Wherever possible, the same reference numerals are used in the drawings and the description to refer to the same or like parts.

FIG. 1A to FIG. 1D are schematic cross-sectional views of a method of manufacturing a light emitting device according to an embodiment of the disclosure. Referring to FIG. 1A, a substrate 100 is provided. The substrate 100 may have an upper surface 102 and a lower surface 104 opposite to each other. According to this embodiment, the substrate 100 may include a rigid substrate, a flexible substrate, or a combination of the foregoing. For example, a material of the substrate 100 may include glass, quartz, sapphire, ceramic, polycarbonate (PC), polyimide (PI), polyethylene terephthalate (PET), other suitable substrate materials, or a combination of the foregoing, but not limited thereto.

Next, a first bonding layer 110a and a first bonding layer 110b are formed on the substrate 100. In detail, the first bonding layer 110a and the first bonding layer 110b may be disposed on the upper surface 102 of the substrate 100 and electrically connected to the substrate 100. The first bonding layer 110a and the first bonding layer 110b may include a first portion 110a1 and a first portion 110b1 and a second portion 110a2 a second portion 110b2. The second portion 110a2 and the second portion 110b2 are located between the first portion 110a1, the first portion 110b1, and the substrate 100. According to this embodiment, a material of the first bonding layer 110a and the first bonding layer 110b may be copper (Cu), but not limited thereto. According to other embodiment, a material of the first bonding layer may be gold (Au), indium (In), tin (Sn) or other solid metal with electrical conductivity. According to this embodiment, the first bonding layer 110a and the first bonding layer 110b may be, for example, bumps, pads, pillars, connectors, or other electrically conductive connection member, but not limited thereto.

Next, referring to FIG. 1A, a first passivation layer 120a and a first passivation layer 120b are formed on the first bonding layer 110a and the first bonding layer 110b. In detail, the first passivation layer 120a and the first passivation layer 120b may have a top surface 122a and a top surface 122b and a bottom surface 124a and a bottom surface 124b opposite to each other. The bottom surface 124a and the bottom surface 124b may directly contact a surface 112a and a surface 112b of the first bonding layer 110a and the first bonding layer 110b away from the substrate 100. That is, the first passivation layer 120a and the substrate 100 are respectively located at opposite sides of the first bonding layer 110a, and the first passivation layer 120b and the substrate 100 are respectively located at opposite sides of the first bonding layer 110b. Areas of the bottom surface 124a and the bottom surface 124b of the first passivation layer 120a and the first passivation layer 120b may be substantially greater than or equal to areas of the surface 112a and the surface 112b of the first bonding layer 110a and the first bonding layer 110b. In a case of the same area, orthographic projections of the first passivation layer 120a and the first passivation layer 120b on the first bonding layer 110a and the first bonding layer 110b may substantially completely overlap the surface 112a and the surface 112b of the first bonding layer 110a and the first bonding layer 110b. When the bottom surface 124a and the bottom surface 124b of the first passivation layer 120a and the first passivation layer 120b are greater than the areas of the surface 112a and the surface 112b of the first bonding layer 110a and the first bonding layer 110b, at least a portion of the first passivation layer 120a and the first passivation layer 120b may cover sides of the first bonding layer 110a and the first bonding layer 110b. In FIG. 1A, side surfaces of the first bonding layer 110a and the first bonding layer 110b are perpendicular to a bottom surface 114a and a bottom surface 114b of the first bonding layer 110a and the first bonding layer 110b, but the disclosure is not limited thereto. According to some embodiments, an angle between the side surfaces of the first bonding layer 110a and the first bonding layer 110b and the bottom surface 114a and the bottom surface 114b may be between 15 degrees and 90 degrees (15 degrees≤the angle≤90 degrees). According to this embodiment, a material of the first passivation layer 120a and the first passivation layer 120b may include silver (Ag), gold (Au), chromium (Cr), hafnium (Hf), iridium (Ir), molybdenum (Mo), niobium (Nb), osmium (Os), palladium (Pd), platinum (Pt), Rhenium (Re), rhodium (Rh), ruthenium (Ru), tantalum (Ta), titanium (Ti), vanadium (V), tungsten (W) or zirconium (Zr) or other relatively stable pure metal materials that are less prone to oxidation, low activity, high melting point, etc., but not limited thereto. Here, the first passivation layer 120a and the first passivation layer 120b may be formed by, for example, chemical coating or other suitable processes, but the disclosure is not limited in this regard. According to this embodiment, the first passivation layer 120a and the first passivation layer 120b have a thickness T1 between the top surface 122a and the top surface 122b and the bottom surface 124a and the bottom surface 124b, and the thickness T1 may range, for example, from 20 Å to 250 Å (20 Å≤T1≤250 Å), but is not limited thereto. According to some embodiments, the thickness T1 of the first passivation layer 120a and the first passivation layer 120b may also range, for example, from 50 Å to 150 Å (50 Å≤T1≤150 Å). According to this embodiment, the thickness T1 may be, for example, a maximum thickness of the first passivation layer 120a and the first passivation layer 120b measured along a normal direction Z of the substrate 100.

Figure 1B:
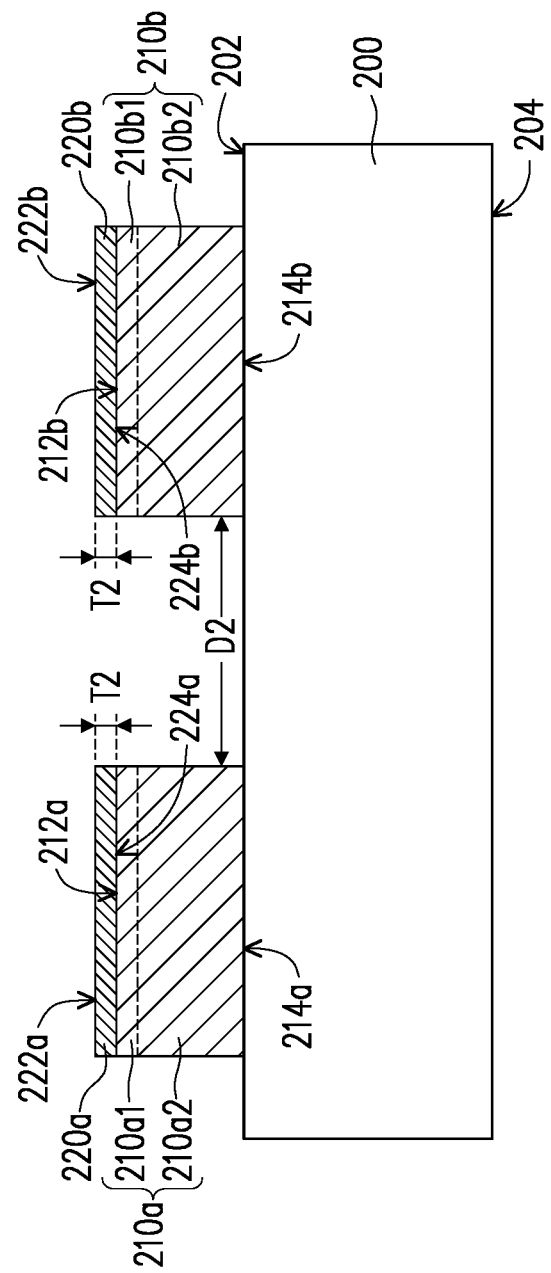

Then, referring to FIG. 1B, a light emitting element 200 is provided. The light emitting element 200 may have an active surface 202 and a back surface 204, and the active surface 202 and the back surface 204 are opposite to each other.

Next, a second bonding layer 210a and a second bonding layer 210b are formed on the light emitting element 200. In detail, the second bonding layer 210a and the second bonding layer 210b may be disposed on the active surface 202 of the light emitting element 200 and electrically connected to the light emitting element 200. The second bonding layer 210a and the second bonding layer 210b may include a third portion 210a1 and a third portion 210b1 and a fourth portion 210a2 and a fourth portion 210b2. The fourth portion 210a2 and the fourth portion 210b2 are located between the third portion 210a1 and the third portion 210b1 and the light emitting element 200. According to the disclosure, a material of the second bonding layer 210a and the second bonding layer 210b may be same as or different from the material of the first bonding layer 110a and the first bonding layer 110b. According to this embodiment, the material of the second bonding layer 210a and the second bonding layer 210b may be copper (Cu), but not limited thereto. According to other embodiment, a material of the second bonding layer may be gold (Au), indium (In), Tin (Sn) or other solid metal with electrical conductivity. According to this embodiment, the second bonding layer 210a and the second bonding layer 210b may be, for example, bumps, pads, pillars, connectors, or other electrically conductive connection member, but not limited thereto.

Referring to FIG. 1B, a second passivation layer 220a and a second passivation layer 220b are formed on the second bonding layer 210a and the second bonding layer 210b. In detail, the second passivation layer 220a and the second passivation layer 220b may have a top surface 222a and a top surface 222b and a bottom surface 224a and a bottom surface 224b opposite to each other. The bottom surface 224a and the bottom surface 224b may directly contact a surface 212a and a surface 212b of the second bonding layer 210a and the second bonding layer 210b away from the light emitting element 200. That is, the second passivation layer 220a and the light emitting element 200 are respectively located at opposite sides of the second bonding layer 210a, and the second passivation layer 220b and the light emitting element 200 are respectively located at opposite sides of the second bonding layer 210b. Areas of the bottom surface 224a and the bottom surface 224b of the second passivation layer 220a and the second passivation layer 220b may be substantially equal to or greater than areas of the surface 212a and the surface 212b of the second bonding layer 210a and the second bonding layer 210b. In a case of the same area, orthographic projections of the second passivation layer 220a and the second passivation layer 220b on the second bonding layer 210a and the second bonding layer 210b may substantially completely overlap the surface 212a and the surface 212b of the second bonding layer 210a and the second bonding layer 210b. When the bottom surface 224a and the bottom surface 224b of the second passivation layer 220a and the second passivation layer 220b are greater than the areas of the surface 212a and the surface 212b of the second bonding layer 210a and the second bonding layer 210b, at least a portion of the second passivation layer 220a and the second passivation layer 220b may cover sides of the second bonding layer 210a and the second bonding layer 210b. In FIG. 1B, side surfaces of the second bonding layer 210a and the second bonding layer 210b are perpendicular to a bottom surface 214a and a bottom surface 214b of the second bonding layer 210a and the second bonding layer 210b, but the disclosure is not limited thereto. According to some embodiments, an angle between the side surfaces of the second bonding layer 210a and the second bonding layer 210b and the bottom surface 214a and the bottom surface 214b may be between 15 degrees and 90 degrees (15 degrees≤the angle≤90 degrees). According to this embodiment, a material of the second passivation layer 220a and the second passivation layer 220b may include silver, gold, chromium, hafnium, iridium, molybdenum, niobium, osmium, palladium, platinum, Rhenium, rhodium, ruthenium, tantalum, titanium, vanadium, tungsten or zirconium, or other relatively stable pure metal materials that are less prone to oxidation, low activity, high melting point, etc., but not limited thereto.

Here, the material of the first passivation layer 120a and the first passivation layer 120b may be, for example, same as the material of the second passivation layer 220a and the second passivation layer 220b, and the second passivation layer 220a and the second passivation layer 220b may be formed by, for example, chemical coating or other suitable processes, but the disclosure is not limited in this regard. According to this embodiment, the second passivation layer 220a and the second passivation layer 220b have a thickness T2 between the top surface 222a and the top surface 222b and the bottom surface 224a and the bottom surface 224b, and the thickness T2 may range, for example, from 20 Å to 250 Å (20 Å≤T2≤250 Å), but is not limited thereto. According to some embodiments, the thickness T2 of the second passivation layer 220a and the second passivation layer 220b may also range, for example, from 50 Å to 150 Å (50 Å≤T2≤150 Å). According to this embodiment, the thickness T2 may be, for example, a maximum thickness of the second passivation layer 220a and the second passivation layer 220b measured along a normal direction Z' of the light emitting element 200.

Referring FIG. 1A and FIG. 1B at the same time, a first spacing D1 exists between the first bonding layer 110a and the first bonding layer 110b, in which the first bonding layer 110a and the first bonding layer 110b are adjacent to each other, and a second spacing D2 exists between the second bonding layer 210a and the second bonding layer 210a, in which the second bonding layer 210a and the second bonding layer 210a are adjacent to each other. A size of the first spacing D1 is approximately the same as a size of the second spacing D2. The size of the first spacing D1 may be, for example, less than or equal to 100 μm (0 μm<D1≤100 μm). Similarly, the size of the second spacing D2 may be, for example, less than or equal to 100 μm (0 μm<D2≤100 μm), but not limited thereto.

Figure 1C:
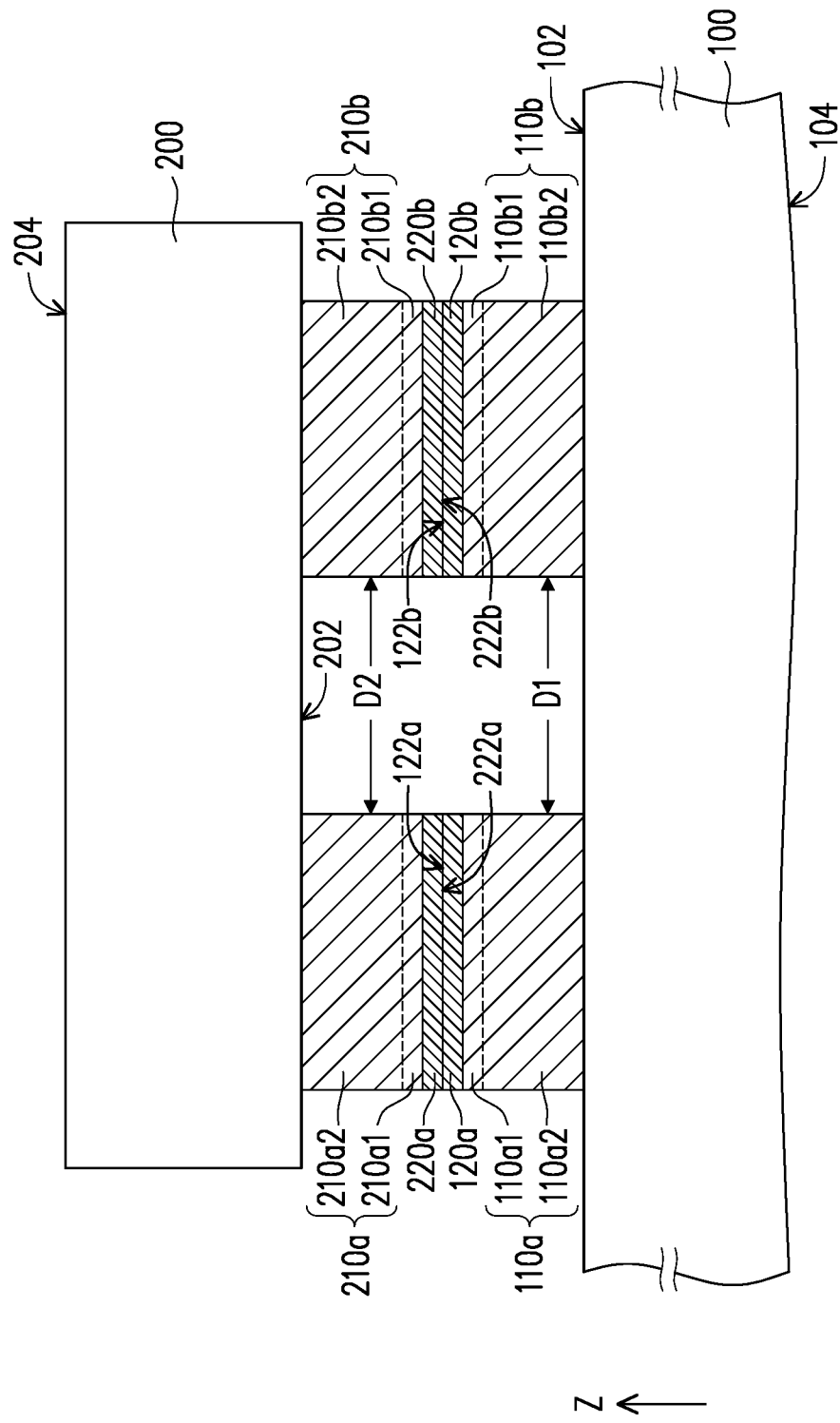

Then, referring to FIG. 1C, the second passivation layer 220a and the second passivation layer 220b on the light emitting element 200 are contacted with the first passivation layer 120a and the first passivation layer 120b. Specifically, the light emitting element 200 of FIG. 1B is flipped upside down, so that the light emitting element 200 is bonded to the substrate 100 in a flip chip manner. The top surface 122a of the first passivation layer 120a may directly contact the top surface 222a of the second passivation layer 220a, and the top surface 122b of the first passivation layer 120b may directly contact the top surface 222b of the second passivation layer 220b.

Figure 1D:
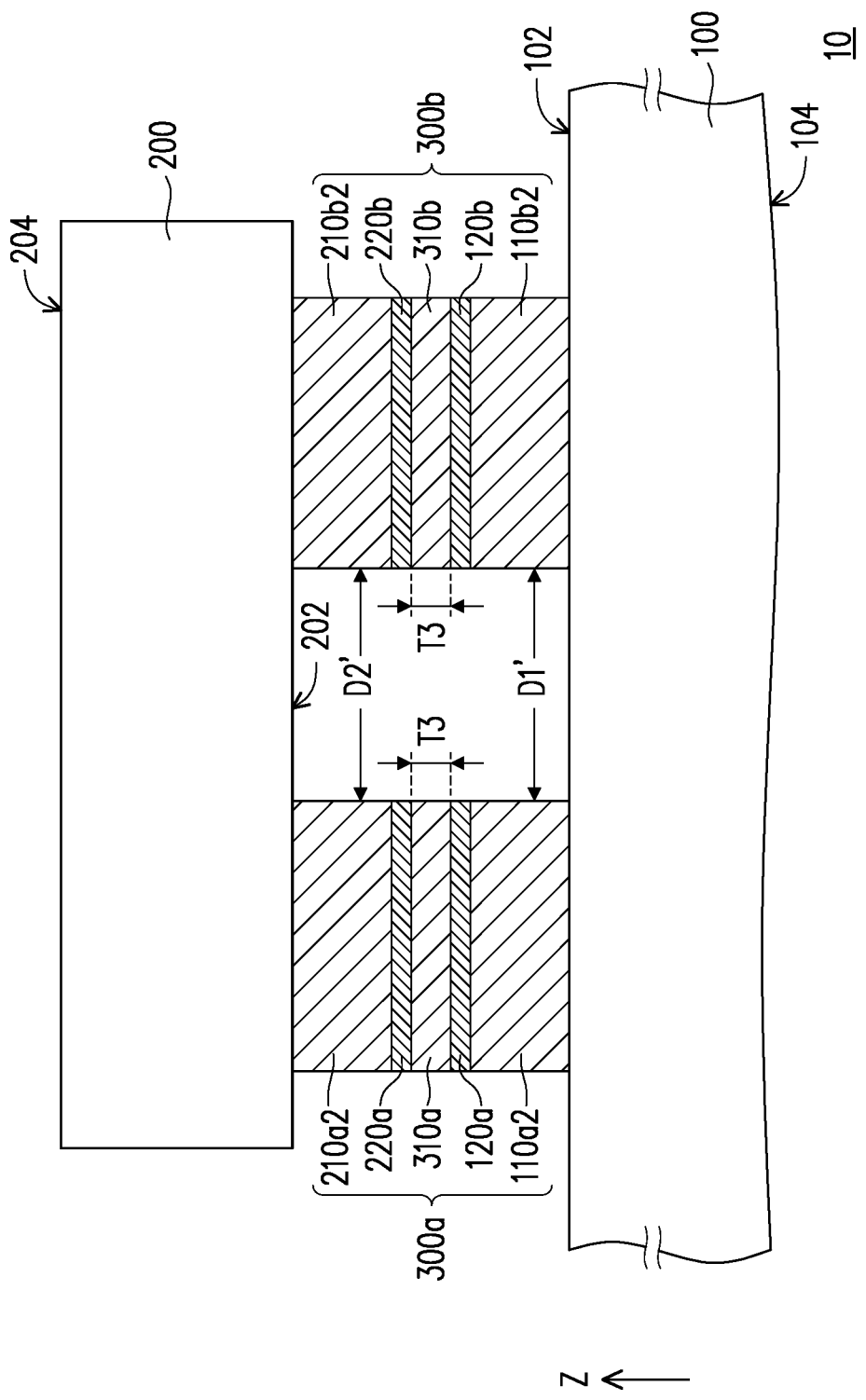

Then, referring to FIG. 1C and FIG. 1D at the same time, after the light emitting device 200 is bonded to the substrate 100, a third bonding layer 310a and a third bonding layer 310b are gradually formed and the light emitting device 200 is bonded to the substrate 100. Specifically, when the second passivation layer 220a and the second passivation layer 220b on the light emitting element 200 contact the first passivation layer 120*a* and the first passivation layer 120*b* on the substrate 100, a diffusion step is performed, and by applying suitable conditions such as time, temperature, and/or pressure, metal atoms of the first portion 110*a*1 and the first portion 110*b*1 of the first bonding layer 110*a* and the first bonding layer 110*b* may be diffused in the diffusion step in a direction toward the light emitting element 200 and pass through the first passivation layer 120*a* and the first passivation layer 120*b*, and/or metal atoms of the first passivation layer 120*a* and the first passivation layer 120*b* may be diffused in a direction toward the substrate 100 and pass through the first portion 110*a*1 and the first portion 110*b*1 of the first bonding layer 110*a* and the first bonding layer 110*b*. Similarly, in the diffusion step, metal atoms of the third portion 210*a*1 and the third portion 210*b*1 of the second bonding layer 210*a* and second bonding layer 210*b* may be diffused in the direction toward the substrate 100 and pass through the second passivation layer 220*a* and the second passivation layer 220*b*, and/or metal atoms of the second passivation layer 220*a* and the second passivation layer 220*b* may be diffused in the direction toward the light emitting element 200 and pass through the third portion 210*a*1 and the third portion 210*b*1 of the second bonding layer 210*a* and the second bonding layer 210*b*. Thereby, the metal atoms of the first bonding layer 110*a* and the first bonding layer 110*b* and the first passivation layer 120*a* and the first passivation layer 120*b* may be diffused with each other, and the metal atoms of the second bonding layer 210*a* and the second bonding layer 210*b* and the second passivation layer 220*a* and the second passivation layer 220*b* may be diffused with each other, thereby forming the third bonding layer 310*a* and the third bonding layer 310*b*. The third bonding layer 310*a* and the third bonding layer 310*b* are located between the first passivation layer 120*a* and the first passivation layer 120*b* and the second passivation layer 220*a* and the second passivation layer 220*b*. The third bonding layer 310*a* and the third bonding layer 310*b* may include the metal atoms from the first portion 110*a*1 and the first portion 110*b*1 of the first bonding layer 110*a* and the first bonding layer 110*b* and the metal atoms from the third portion 210*a*1 and the third portion 210*b*1 of the second bonding layer 210*a* and the second bonding layer 210*b*. According to this embodiment, the third bonding layer 310*a* and the third bonding layer 310*b* have a thickness T3 (that is, a distance between the first passivation layer 120*a* and the second passivation layer 220*a*, in which the first passivation layer 120*a* and the second passivation layer 220*a* are adjacent to each other), which may be, for example, 10 Å to 200 Å (10↑≤T2≤200 Å), but not limited thereto. According to some embodiments, a range of the thickness T3 may be greater than 200 Å. And with the increase of diffusion time, temperature and pressure, the thickness T3 will increase. The thickness T3 may be, for example, a maximum thickness of the third bonding layer 310*a* and the third bonding layer 310*b* measured along the normal direction Z of the substrate 100.

As shown in FIG. 1D, the light emitting element 200 may be bonded to the substrate 100 through a bonding structure 300*a* and a bonding structure 300*b* (including, for example, at least the fourth portion 210*a*2 and the fourth portion 210*b*2 of the second bonding layer 210*a* and the second bonding layer 210*b*, the second passivation layer 220*a* and the second passivation layer 220*b*, the third bonding layer 310*a* and the third bonding layer 310*b*, the first passivation layer 120*a* and the first passivation layer 120*b*, and the second portion 110*a*2 and the second portion 110*b*2 of the first bonding layer 110*a* and the first bonding layer 110*b*), and a light emitting device 10 of this embodiment is manufactured. In other words, the light emitting device 10 of this embodiment may include the substrate 100, the light emitting element 200, and the bonding structure 300*a* and the bonding structure 300*b*. The light emitting element 200 may be disposed on the substrate 100 through the bonding structure 300*a* and the bonding structure 300*b*.

Since the bonding structure 300*a* and the bonding structure 300*b* have approximately the same structure, the following is a further description of the bonding structure 300*a* as an example. Referring to FIG. 1D, according to this embodiment, the bonding structure 300*a* may include at least three bonding layers (i.e., the fourth portion 210*a*2 of the second bonding layer 210*a*, the third bonding layer 310*a*, and the second portion 110*a*2 of the first bonding layer 110*a*) and at least two passivation layers (i.e., the second passivation layer 220*a* and first passivation layer 120*a*) in a staggered arrangement. More specifically, according to this embodiment, the first passivation layer 120*a* may be located between the second portion 110*a*2 of the first bonding layer 110*a* and the third bonding layer 310*a*, the third bonding layer 310*a* may be located between the second passivation layer 220*a* and the first passivation layer 120*a*, and the second passivation layer 220*a* may be located between the fourth portion 210*a*2 of the second bonding layer 210*a* and the third bonding layer 310*a*.

According to this embodiment, the time, temperature, and pressure applied during the metal atom diffusion step do not cause the first bonding layer 110*a*, the first passivation layer 120*a*, the second bonding layer 210*a*, and the second passivation layer 220*a* to melt, but allow the first bonding layer 110*a*, the first passivation layer 120*a*, the second bonding layer 210*a*, and the second passivation layer 220*a* to form the third bonding layer 310*a* by diffusion in a solid state, and to bond the first bonding layer 110*a* to the second bonding layer 210*a*.

According to this embodiment, the conditions of time, temperature, and pressure applied during the diffusion step may be, for example, 1 minute of diffusion at a pressure of 50 MPa and a temperature of 200° C., but is not limited thereto. According to some embodiments, the conditions under which the diffusion step is performed may also be 1 minute of diffusion at a pressure of 10 MPa and a temperature of 400° C. According to some embodiments, the conditions under which the diffusion step is performed may also be 10 minutes of diffusion at a pressure of 50 MPa and a temperature of 150° C. According to other embodiments, the conditions of time, temperature, and pressure applied during the diffusion step may also be adjusted, for example, in the following manner. For example, when the value of one or both of time, temperature, and pressure is increased, the value of the remaining one or both may be decreased. In addition, according to some other embodiments, diffusion reaction may continue after the diffusion step has been completed (i.e., the original process conditions of time, temperature, and pressure are no longer supplied).

According to this embodiment, bonding between solid metal and solid metal (e.g. between the first bonding layer 110*a* and the second bonding layer 210*a*, and more specifically between metal atoms passing from the first bonding layer 110*a* through the first passivation layer 120*a* and metal atoms passing from the second bonding layer 210*a* through the second passivation layer 220*a*) may be, for example, bonding between gold and gold, bonding between copper and copper, or bonding between indium and tin, but not limited thereto. That is, the material of the first bonding layer 110*a* may be the same as or different from the material of the second bonding layer 210a, but a material of each bonding layer may not be limited to the materials.

According to this embodiment, when bonding between solid metal and solid metal, metallic bonds between the solid metal and the solid metal have a large number of shared electron orbit, and it is easier to diffuse and move between solid metal atoms than electronic structure of metal oxide, which requires the formation of an octet structure. Therefore, presence of oxidized metal at a bonding interface may prevent the diffusion of the solid metal and lead to the failure of the bonding between the solid metal and the solid metal. Therefore, in the manufacturing method according to this embodiment, oxidation of the first bonding layer 110a and the second bonding layer 210a due to contact with air may be reduced by providing metal materials (e.g., the first passivation layer 120a and the second passivation layer 220a) that are not easily oxidized, and thus the first bonding layer 110a and the second bonding layer 210a may be bonded by diffusion.

However, according to some embodiments, the first bonding layer 110a (or the second bonding layer 210a), which is not easily oxidized, may also optionally be provided without an additional first passivation layer 120a (or the second passivation layer 220a). For example, when the first bonding layer 110a and the second bonding layer 210a are made of gold that is not easily oxidized, the first bonding layer and the second bonding layer may be directly contacted by the first bonding layer without the need for an additional first passivation layer and second passivation layer. When the gold that is not easily oxidized is used as the first bonding layer 110a and a solid metal that is easily oxidized (for example, copper) is used as the second bonding layer 210a, a second passivation layer must be additionally provided on the second bonding layer, so that the first bonding layer may be directly contact the second passivation layer 220a.

It should be noted that, according to this embodiment, the thickness T1 of the first passivation layer 120a and/or the thickness T2 of the second passivation layer 220a may range from 20 Å to 250 Å (20 Å≤the thickness T2≤250 Å) or from 50 Å to 150 Å (50 Å≤the thickness T2≤150 Å), but not limited thereto. It should be noted that a passivation layer that is too thin tends to reduce the ability to protect the bonding layer due to poor thickness uniformity, and a passivation layer that is too thick requires higher process time, temperature or pressure to allow the bonding layer to diffuse. An appropriate range of the thickness of the passivation layer may allow the solid metal (e.g., copper) in the first bonding layer 110a to diffuse relatively quickly through the first passivation layer 120a, and allows the solid metal (e.g., copper) in the second bonding layer 210a to diffuse relatively quickly through the second passivation layer 220a and be less susceptible to metal oxides.

In addition, since the third bonding layer 310a is formed by the diffusion of metal atoms of the first bonding layer 110a and the second bonding layer 210a, the material of the third bonding layer 310a may include the material of the first bonding layer 110a and the material of the second bonding layer 210a. For example, according to this embodiment, when the material of the first bonding layer 110a is copper and the material of the second bonding layer 210a is copper, the material of the third bonding layer 310a may be copper, for example. According to some embodiments, when the material of the first bonding layer is gold and the material of the second bonding layer is gold, the material of the third bonding layer may be gold, for example. According to some embodiments, when the material of the first bonding layer is tin and the material of the second bonding layer is indium, the material of the third bonding layer may, for example, include indium and tin.

Since the third bonding layer 310a is formed by the diffusion of metal atoms from the first bonding layer 110a and the second bonding layer 210a, concentration distribution of metal atoms may not be uniform throughout the third bonding layer 310a. However, according to this embodiment, when using an elemental analyzer to analyze composition of the third bonding layer 310a, analysis results may be interfered by signals of the first passivation layer 120a and the second passivation layer 220a at opposite sides of the third bonding layer 310a due to measurement capability of the instrument itself. For example, according to this embodiment, when the material of the first bonding layer 110a is copper and the material of the second bonding layer 210a is also copper, the material of the third bonding layer 310a measured using the element analyzer may, for example, include more than 50% copper, but not limited thereto. According to other embodiments, the material of the third bonding layer 310a, which may also be measured, may for example include 80% to 100% copper. Therefore, according to this embodiment, the third bonding layer 310a and the third bonding layer 310b are defined as a region where "the concentration of the same metal atoms as in the first bonding layer 110a and the first bonding layer 110b and/or the second bonding layer 210a and the second bonding layer 210b is greater than or equal to 50% in the two passivation layers".

In short, in the light emitting device 10 and the manufacturing method thereof according to the embodiment of the disclosure, the third bonding layer 310a and the third bonding layer 310b may be formed between the first passivation layer 120a and the first passivation layer 120b and the second passivation layer 220a and the second passivation layer 220b without melting the solid metal by means of mutual diffusion between the solid metal and the solid metal. In this way, the light emitting device 200 may be bonded to the substrate 100 through the bonding structure 300a and the bonding structure 300b. In addition, since the first spacing D1 (or the second spacing D2) before bonding may be substantially the same as a first spacing D1' (or a second spacing D2') after bonding, the light emitting device 10 of the disclosure and the manufacturing method thereof may reduce the problem of short-circuit during bonding or may improve the bonding yield compared to a case where a first spacing (or a second spacing) may be shortened due to overflow of solder after bonding using molten solder.

Other embodiments are set forth below for illustrative purposes. It should be noted here that the following embodiments follow the numeral references and parts of the previous embodiments, where the same numeral references are used to indicate the same or similar components, and the description of the same technical content is omitted. The description of the omitted parts can be found in the preceding embodiments, and will not be repeated in the following embodiments.

Figure 2:
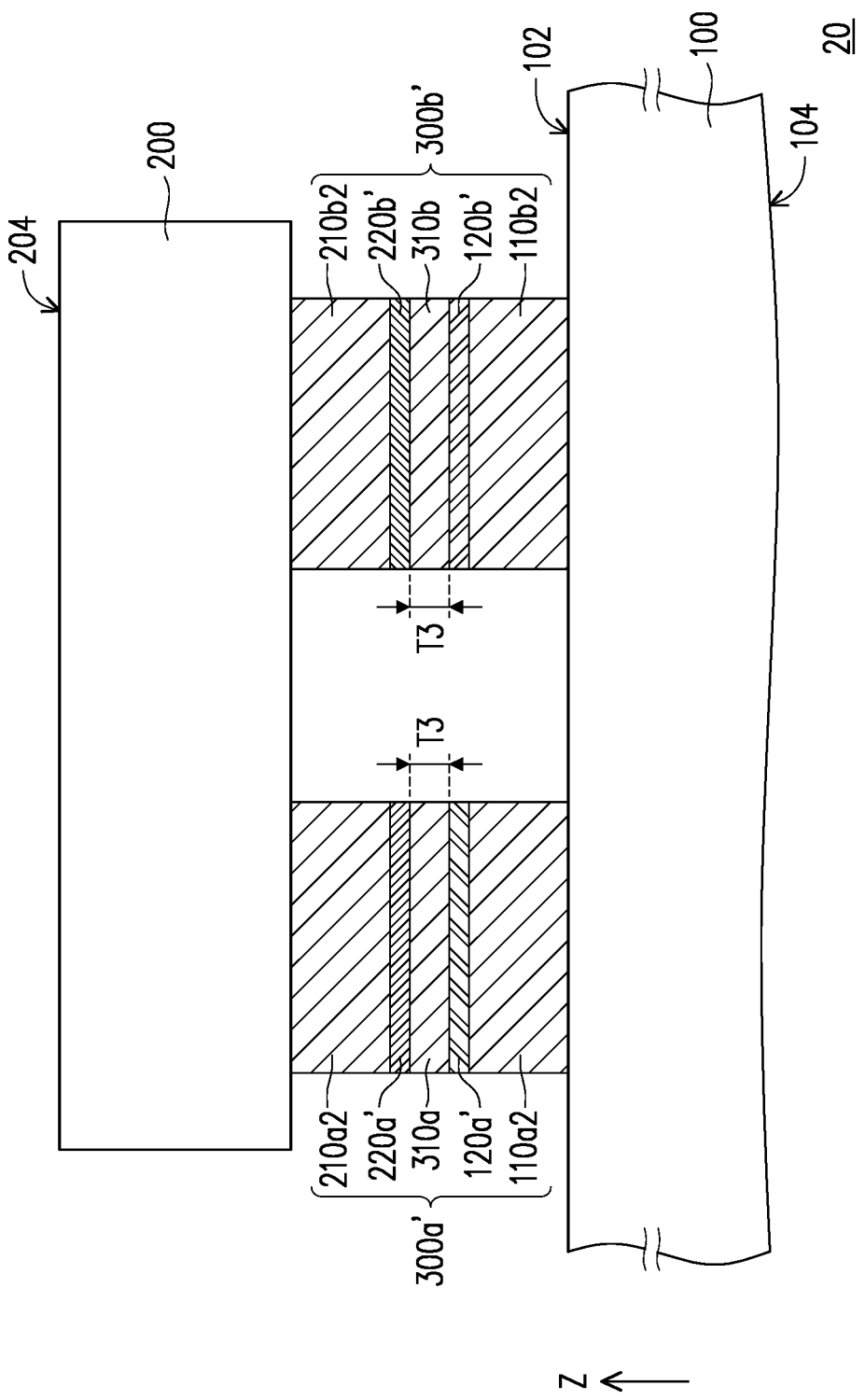
FIG. 2 is a schematic cross-sectional view of a light emitting device according to another embodiment of the disclosure.

FIG. 2 is a schematic cross-sectional view of a light emitting device according to another embodiment of the disclosure. Referring FIG. 2 and FIG. 1D at the same time, a light emitting device 20 according to this embodiment is substantially similar to the light emitting device 10 of FIG. 1D, so the same and similar components of the two embodiments are not repeated here. The light emitting device 20 according to this embodiment differs from the light emitting device 10 mainly in that in the light emitting device 20 according to this embodiment, a material of a first passivation layer 120a' and a first passivation layer 120b' and a material of a second passivation layer 220a' and a second passivation layer 220b' may be different.

Specifically, referring to FIG. 2, according to this embodiment, the light emitting device 20 may include the substrate 100, the light emitting element 200, and a bonding structure 300a' and a bonding structure 300b'. The light emitting element 200 may be disposed on the substrate 100 through the bonding structure 300a' and the bonding structure 300b'.

The following is a description of the bonding structure 300a' as an example. Similar to the bonding structure 300a in the previous embodiment, the bonding structure 300a' may include at least three bonding layers (i.e., the fourth portion 210a2 of the second bonding layer 210a, the third bonding layer 310a, and the second portion 110a2 of the first bonding layer 110a) and at least two passivation layers (i.e., the second passivation layer 220a' and the first passivation layer 120a') in a staggered arrangement. More specifically, according to this embodiment, the first passivation layer 120a' may be located between the second portion 110a2 of the first bonding layer and the third bonding layer 310a, and the third bonding layer 310a may be located between the second passivation layer 220a' and the first passivation layer 120a', and the second passivation layer 220a' may be located between the fourth portion 210a2 of the second bonding layer 210a and the third bonding layer 310a.

The following are examples of possible combinations of a material of the first passivation layer 120a' and a material of the second passivation layer 220a' according to this embodiment, but the disclosure is not limited thereto. According to this embodiment, the material of the first passivation layer 120a' (or the second passivation layer 220a') may be silver or titanium, for example, and the material of the second passivation layer 220a' (or the first passivation layer 120a') may be gold, for example. Since silver, titanium, and gold are commonly used metals in the manufacturing process of light emitting devices, the manufacturing method using silver or titanium as the material for the first passivation layer 120a' (or the second passivation layer 220a') and gold as the material for the second passivation layer 220a' (or the first passivation layer 120a') is compatible with the manufacturing process of various types of light emitting devices.

According to some embodiments, the material of the first passivation layer 120a' may be, for example, palladium, and the material of the second passivation layer 220a' may be, for example, gold. Since palladium can be grown on a surface of the first bonding layer 110a by chemical coating, and the chemical coating process is highly compatible with the process of the light emitting device and easy to perform, the manufacturing method using palladium as the material of the first passivation layer 120a' and gold as the material of the second passivation layer 220a' is also compatible with the manufacturing process of various types of light emitting devices.

In summary, in the light emitting device and the manufacturing method thereof according to the embodiment of the disclosure, the third bonding layer may be formed between the first passivation layer and the second passivation layer without melting the solid metal by means of mutual diffusion between the solid metal and the solid metal (i.e., between the second bonding layer and the second passivation layer, or between the first bonding layer and the first passivation layer, but not limited thereto). In this way, the second bonding layer may be bonded to the first bonding layer through the second passivation layer, the third bonding layer, and the first passivation layer, and the light emitting element may be bonded to the substrate through the bonding structure (i.e., including the second bonding layer, the second passivation layer, the third bonding layer, the first passivation layer, and the first bonding layer). In addition, since a first spacing (or a second spacing) before bonding may be substantially the same as a first spacing (or a second spacing) after bonding, the light emitting device of the disclosure and the manufacturing method thereof may reduce the problem of short-circuit during bonding or may improve the bonding yield compared to a case using molten solder, which causes short-circuit of two adjacent first bonding layers (or two adjacent second bonding layers) due to shortening of the first spacing (or the second spacing) after bonding.

A number of contacts of the light emitting element according to each embodiment of the disclosure is two, but is not limited thereto. There may be more contacts on one element among different elements, or a light emitting element with a special structure may only have a single contact, and the light emitting device may be completed by the bonding method shown in this disclosure.

Finally, it should be noted that the above embodiments are intended only to illustrate the technical solutions of the disclosure and not to limit them. Although the disclosure is described in detail with reference to the foregoing embodiments, it will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for manufacturing a light emitting device comprising:
    providing a substrate;
    forming a first bonding layer on the substrate;
    forming a first passivation layer on the first bonding layer;
    providing a light emitting element;
    forming a second bonding layer on the light emitting element;
    forming a second passivation layer on the second bonding layer;
    contacting the second passivation layer on the light emitting element with the first passivation layer on the substrate to form a third bonding layer between the substrate and the light emitting element and to bond the light emitting element to the substrate,
    wherein a material of the third bonding layer is composed of a material of the first bonding layer and a material of the second bonding layer,
    wherein a material of the first passivation layer and a material of the second passivation layer are a pure metal material.

2. The manufacturing method according to claim 1, wherein the material of the first passivation layer and the material of the second passivation layer are silver, gold, chromium, hafnium, iridium, molybdenum, niobium, osmium, palladium, platinum, rhenium, rhodium, ruthenium, tantalum, titanium, vanadium, tungsten or zirconium.

3. The manufacturing method according to claim 1, wherein the material of the first bonding layer is same as the material of the second bonding layer.

4. The manufacturing method according to claim 1, wherein contacting the second passivation layer on the light emitting element with the first passivation layer to form the third bonding layer comprises:

performing a diffusion step to diffuse a portion of the first bonding layer and pass through the first passivation layer, and to diffuse a portion of the second bonding layer and pass through the second passivation layer; and forming the third bonding layer between the first passivation layer and the second passivation layer, wherein the third bonding layer comprises the portion of the first bonding layer and the portion of the second bonding layer.

5. The manufacturing method according to claim 1, wherein the material of the first passivation layer is different from the material of the second passivation layer.

6. The manufacturing method according to claim 1, wherein the material of the first passivation layer is same as the material of the second passivation layer.

7. The manufacturing method according to claim 1, wherein a thickness of the first passivation layer and a thickness of the second passivation layer are 20 Å to 250 Å.

8. The manufacturing method according to claim 1, wherein a thickness of the third bonding layer is 10 Å to 200 Å.

9. The manufacturing method according to claim 1, wherein an area of the first passivation layer is greater than or equal to an area of the first bonding layer, and an area of the second passivation layer is greater than or equal to an area of the second bonding layer.

10. The manufacturing method according to claim 1, wherein an orthographic projection of the first passivation layer to the first bonding layer overlaps the first bonding layer, and an orthographic projection of the second passivation layer to the second bonding layer overlaps the second bonding layer.

11. A light emitting device comprising:
a substrate;
a light emitting element disposed on the substrate; and
a bonding structure, wherein the light emitting element is disposed on the substrate through the bonding structure, and the bonding structure comprises:
at least three bonding layers comprising a first bonding layer, a second bonding layer, and a third bonding layer; and
at least two passivation layers comprising a first passivation layer and a second passivation layer;
wherein the first passivation layer is located between the first bonding layer and the third bonding layer, and the second passivation layer is located between the second bonding layer and the third bonding layer,
wherein a material of the third bonding layer is composed of a material of the first bonding layer and a material of the second bonding layer,
wherein a material of the first passivation layer and a material of the second passivation layer are a pure metal material.

12. The light emitting device according to claim 11, wherein the material of the first passivation layer is different from a material of the second passivation layer.

13. The light emitting device according to claim 11, wherein the material of the first passivation layer is same as the material of the second passivation layer.

14. The light emitting device according to claim 11, wherein the material of the first passivation layer and the material of the second passivation layer are silver, gold, chromium, hafnium, iridium, molybdenum, niobium, osmium, palladium, platinum, rhenium, rhodium, ruthenium, tantalum, titanium, vanadium, tungsten or zirconium.

15. The light emitting device according to claim 11, wherein the third bonding layer is located between the second passivation layer and the first passivation layer.

16. The light emitting device according to claim 11, wherein the material of the first bonding layer is same as the material of the second bonding layer.

17. The light emitting device according to claim 11, wherein a thickness of the first passivation layer and a thickness of the second passivation layer are 20 Å to 250 Å.

18. The light emitting device according to claim 11, wherein a thickness of the third bonding layer is 10 Å to 200 Å.

19. The light emitting device according to claim 11, wherein an area of the first passivation layer is greater than or equal to an area of the first bonding layer, and an area of the second passivation layer is greater than or equal to an area of the second bonding layer.

20. The light emitting device according to claim 11, wherein an orthographic projection of the first passivation layer to the first bonding layer overlaps the first bonding layer, and an orthographic projection of the second passivation layer to the second bonding layer overlaps the second bonding layer.

* * * * *